(12) United States Patent
Willis et al.

(10) Patent No.: US 6,956,744 B2
(45) Date of Patent: Oct. 18, 2005

(54) COMPUTER CHASSIS DRAWER GUIDE

(75) Inventors: Clifford B. Willis, Tracy, CA (US); Robert J. Lajara, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 78 days.

(21) Appl. No.: 10/639,175

(22) Filed: Aug. 11, 2003

(65) Prior Publication Data

US 2004/0080904 A1 Apr. 29, 2004

Related U.S. Application Data

(60) Provisional application No. 60/420,924, filed on Oct. 24, 2002.

(51) Int. Cl.⁷ .............................................. G06F 1/20
(52) U.S. Cl. ................... 361/724; 710/301; 360/97.02; 709/251
(58) Field of Search ................................ 361/724–727, 361/679–687, 730, 707, 736, 716, 741, 752; 710/309–313, 301; 439/59–61; 360/97.02; 709/251; 364/708.1

(56) References Cited

U.S. PATENT DOCUMENTS

| | | | |
|---|---|---|---|
| 3,992,653 A | 11/1976 | Richardson et al. | 361/707 |
| 4,778,401 A | 10/1988 | Boudreau | 439/153 |
| 4,914,552 A | 4/1990 | Kemer | 361/801 |
| 4,985,804 A | 1/1991 | Campbell et al. | 361/687 |
| 5,652,695 A | 7/1997 | Schmitt | 361/685 |
| 5,761,033 A * | 6/1998 | Wilhelm | 361/686 |
| 5,828,546 A | 10/1998 | Tirrell et al. | 361/685 |
| 5,999,365 A | 12/1999 | Hasegawa et al. | 360/97.02 |
| 6,021,049 A | 2/2000 | Thompson et al. | 361/759 |
| 6,061,244 A | 5/2000 | O'Sullivan et al. | 361/727 |
| 6,247,078 B1 | 6/2001 | Ebert et al. | 710/301 |
| 6,272,016 B1 | 8/2001 | Matonis et al. | 361/716 |
| 6,424,523 B1 | 7/2002 | Curtis et al. | 361/685 |
| 6,501,644 B1 | 12/2002 | Silverman et al. | 361/685 |
| 6,556,438 B1 | 4/2003 | Bolognia et al. | 361/687 |
| 6,583,989 B1 | 6/2003 | Guyer et al. | 361/724 |
| 6,594,150 B2 * | 7/2003 | Creason et al. | 361/727 |
| 6,614,662 B2 | 9/2003 | Stickler et al. | 361/777 |
| 6,618,264 B2 | 9/2003 | Megason et al. | 361/579 |
| 6,802,117 B2 | 10/2004 | Dalisay | 29/758 |
| 2002/0124114 A1 | 9/2002 | Bottom et al. | 709/251 |
| 2003/0030988 A1 | 2/2003 | Garnett et al. | 361/724 |
| 2003/0030989 A1 | 2/2003 | Kitchen et al. | 361/724 |
| 2003/0048613 A1 | 3/2003 | Garnett et al. | 361/724 |
| 2003/0117779 A1 | 6/2003 | Gough et al. | 361/728 |
| 2004/0062002 A1 * | 4/2004 | Barringer et al. | 361/687 |
| 2004/0196727 A1 | 10/2004 | Garnett et al. | 365/232 |

* cited by examiner

*Primary Examiner*—Hung Van Duong
(74) *Attorney, Agent, or Firm*—Meyertons Hood Kivlin Kowert & Goetzel, P.C.; B. Noël Kivlin

(57) ABSTRACT

In a chassis for holding drawers containing computer components or the like, accurate alignment of each drawer in its corresponding slot is provided by a plurality of alignment features along an edge of an opening for the drawer. Mating alignment features are provided in each drawer, that engage with the alignment features on the chassis to ensure alignment of the drawer in the chassis. Various different types of alignment features are provided. Mating alignment features may additionally be provided along an opposing edge of the chassis and drawers. After being aligned, the drawers may be fastened to the chassis in a conventional fashion.

20 Claims, 4 Drawing Sheets

COMPUTER CHASSIS DRAWER GUIDE

CROSS-REFERENCE TO RELATED APPLICATION

This application claims priority pursuant to 35 U.S.C. §119(e) to U.S. Provisional Application No. 60/420,924, filed Oct. 24, 2002, which application is specifically incorporated herein, in its entirety, by reference.

BACKGROUND OF THE INVENTION

1. Field of the Invention

The present invention relates to computer chassis for housing computer components, and more particularly, to portions of such chassis as relate to the insertion and removal of modular drawers.

2. Description of Related Art

Various forms of computer chassis are known in the art, for housing components of a computer system or networked computer systems. Such chassis are typically formed primarily of sheet metal components, such as formed sheet steel components, for strength and EMI shielding. In addition, computer chassis often include slots for sliding removable modular drawers into and out of the computer system. The removable drawers are themselves often housed in formed sheet metal housings. As is known in the art, sheet metal is an economical choice for electronics enclosures, but also entails compromises with respect to achievable tolerances and methods of assembly.

Customarily, computer chassis are provided with a plurality of slots, all of which are not necessarily occupied by a removable drawer when the computer system is in use. Often, a plurality of empty slots are available for the insertion of new drawers. A problem arises when drawers are not properly inserted. The first drawer may not be properly aligned in the slot, because of tolerances required to ensure ease of assembly. Consequently, sufficient space may not be left for drawers that will be subsequently inserted, and drawers may need to be removed and realigned to make room for the new drawers. This rearrangement of drawers wastes time, and increases the risk that the computer system will be disrupted by the rearrangement.

Also, if drawers are not properly aligned in their slots, electro-magnetic interference ("EMI") gaskets may not be properly positioned. EMI gaskets may be a part of the drawer and/or chassis design to meet performance and regulatory requirements. If the drawers are not properly aligned to the system chassis, the assembled system may not meet its design specifications for control of EMI, resulting in an unacceptable amount of EMI emanating from the assembled system.

Prior-art computer chassis were not designed to solve these problems, which were not heretofore recognized as important. Although the presence of slots inherently involves a degree of guidance, prior-art chassis do not provide the necessary degree of precise guidance to avoid misalignment in a fool-proof fashion. Instead, prior-art systems rely on the skill of the assembler to properly align each drawer in the chassis, and to fasten each drawer in place after it has been aligned. Prior-art threaded fastenings are not desirable for providing precise alignment of each drawer, because of the difficulty of locating and threading fasteners into sheet-metal components in a precise way.

It is desirable, therefore, to provide a guide system for a computer chassis to ensure that new drawers are more precisely aligned in one of a plurality of empty slots, without the need for special attention by the person assembling the system. It is preferable that the guide system be independent of the fastening system for fastening the drawers to the chassis, and to require little or no additional cost of materials and assembly.

SUMMARY OF THE INVENTION

The present invention provides a guide system for a computer chassis, that ensures drawers are properly aligned in a suitable slot. The guide system may easily be implemented on sheet metal chassis and sheet metal drawer housings for little or no additional cost, and is not limited to sheet metal materials.

In brief, a system according to the invention comprises alignment features positioned adjacent to the edge of a plurality of slots in a computer chassis. The alignment features correspond to mating features on a plurality of removable drawers that may be inserted into the chassis. The alignment features may be positioned so that each drawer to be inserted is guided into a particular position with respect to the available slots. For example, each drawer may be guided to a position that ensures adequate space will be left for remaining drawers. Optionally, the alignment features may differ from one another, so that only a drawer having a mating feature of a corresponding shape may be inserted into a particular slot.

A more complete understanding of the invention will be afforded to those skilled in the art, as well as a realization of additional advantages and objects thereof, by a consideration of the following detailed description of the preferred embodiment. Reference will be made to the appended sheets of drawings which will first be described briefly.

DETAILED DESCRIPTION OF THE PREFERRED EMBODIMENT

The present invention provides a computer chassis with drawer guides that overcome the limitations of the prior art. In the detailed description that follows, like element numerals are used to indicate like elements appearing in one or more of the figures.

Figure 1:
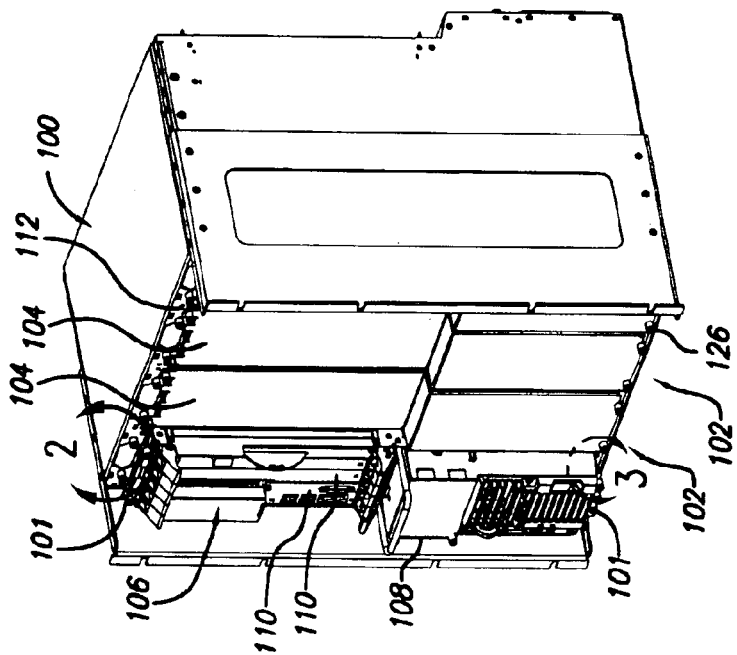
FIG. 1 is a perspective view of chassis for a computer system, with two inserted drawers according to an embodiment of the invention.

FIG. 1 shows a chassis 100 for a network computer system, according to an embodiment of the invention. Chassis 100 may be formed primarily from sheet metal components, as known in the art. In the alternative, chassis 100 may be comprised primarily of materials such as EMI-shielding plastics, or other suitable materials. Chassis 100 may include other suitable components and materials, as known in the art.

Chassis 100 has a plurality of slots 102, three of which are covered by covers 104, and one of which is occupied by drawer 106. In reality, each "slot" may merely comprise a portion of an open bay. There need be no dividers between the slots. Whether of not dividers are present, if a drawer is not properly aligned to its allotted slot, it may not be possible to properly insert an adjoining drawer. Drawers are inserted into the slots 102 through an opening in the front of the chassis. The opening is bordered by opposing edges that may serve for positioning each drawer within its slot. Alignment features, as further described below, may be provided along or adjacent to at least one of these opposing edges.

In the exemplary embodiment, drawer 106 is a system drawer comprising a plurality of modules 108, 110. Module 108 may be a power supply module. Chassis 100 is designed to hold a plurality of system drawers like drawer 106. Each system drawer may be connected to network and power connectors at the back of the chassis. In addition, or in the alternative, provisions may be made for connections at the front panels of the drawers, as shown in FIG. 1. In the alternative, drawer 106 may be a drawer for a system module, instead of for a complete computer system. In such alternative embodiments, each drawer may connect to a system bus at or near the rear of the chassis.

Figure 2:
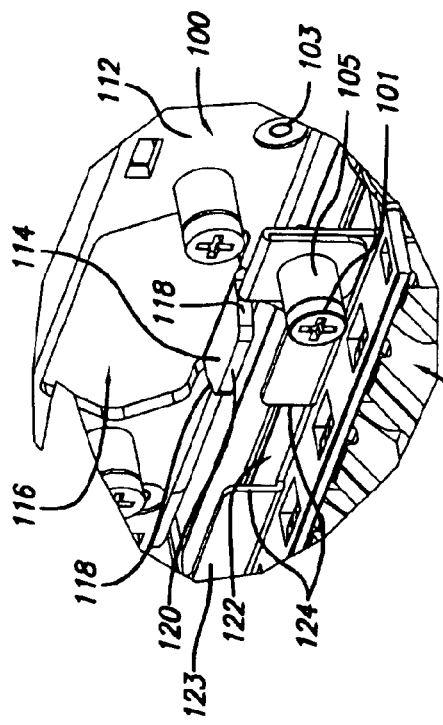
FIG. 2 is a detail view showing a guide tab of the chassis and mating guide cutout of a removable drawer, according to an embodiment of the invention.

Referring to FIGS. 1 and 2, conventional fasteners, for example, threaded fastener 101 which threads into threaded hole 103, may be used to secure drawer 106 to chassis 100, after the drawer is fully inserted into the chassis. The attachment fasteners are not used to align drawers 106 into slots 102. Instead, attachment fasteners like 101 may be allowed to "float" within a housing 105 which allows an amount, such as about 1 mm, of free play for the fastener. The fasteners 101 may then more readily be threaded into their respective threaded holes. In the alternative, conventional oversized attachment through holes in an attachment flange of the drawer (not shown) may be used to retain a fastener. Either way, drawer 106 would be subject to becoming misaligned by the amount of free play or free width of the through hole, were it not for the presence of the alignment features described herein. In other words, fasteners 101 may permit a greater amount of free play than the alignment features. Of course, other attachment fasteners, for example, clips, may be used instead of or in addition to threaded fasteners. Some amount of free play may be a desirable property of these alternative attachment fasteners, as well.

System drawer 106 should be inserted only into a slot 102, and should not occupy portions of more than one slot. Accordingly, again referring to FIGS. 1 and 2, an edge flange 112 along an edge of chassis 100 bordering an opening for slots 102 is provided with a plurality of guide tabs 114. Each guide tab 114 is positioned adjacent to one of slots 102, in a predetermined position relative to the width of the slot. Each guide tab may be formed by creating an opening 116 in the edge flange 112, and folding a portion of material removed for the opening into a tab so that it is approximately orthogonal to flange 112. Side edges 118 of the tab may be tapered towards its end 120, so as to more readily guide the top edge of drawer 106. When drawer 106 is fully inserted into the chassis, edges 122 of cutout 122 should be closely adjacent to, or in contact with, guide tab 114.

System drawer 106 is provided with a corresponding cutout 122 in an upper flange 123, adjacent to an upper periphery of drawer 106. Cutout 122 is sized and positioned so as to guide drawer 106 into slot 102, by engaging guide tab 114 with edges 124 of cutout 122. In the alternative, or in addition, other mating guide features may be provided, for example, pins and mating holes. Tabs 114 and cutouts 122 have the advantage of being readily formed using the same sheet metal forming operations as generally used to form components of chassis 100 and drawer housing 106.

Figure 3:
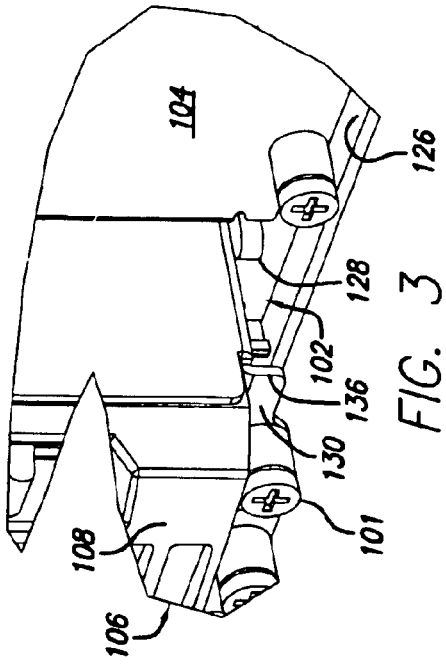
FIG. 3 is a detail view showing an alignment tab of the chassis and a mating guide flange of a removable drawer, according to an embodiment of the invention.
Figure 4:
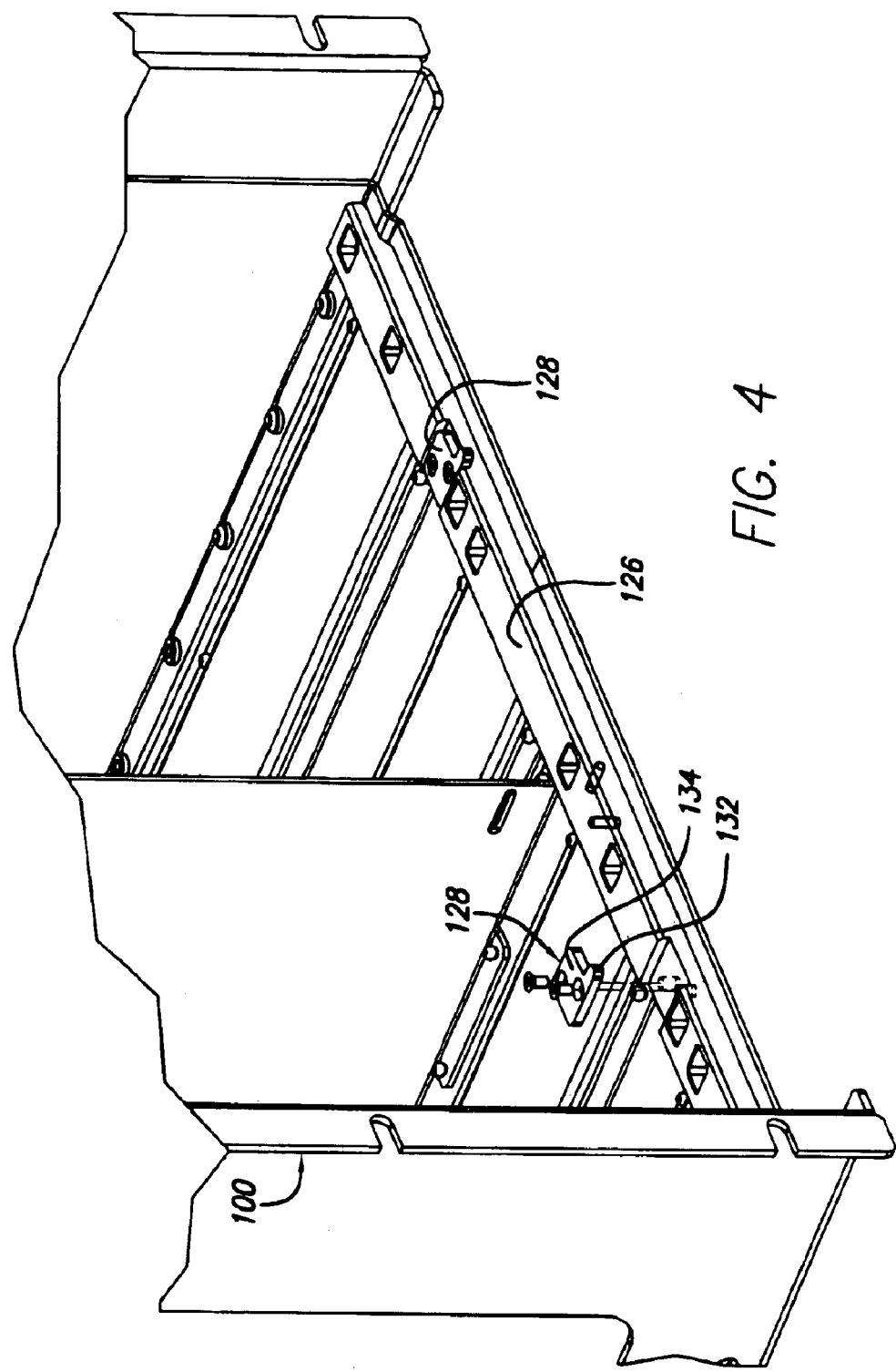
FIG. 4 is a detail view of a lower edge of the chassis, showing protruding alignment prongs attached along a lower edge of the chassis.

In the alternative, or in addition to an edge flange 112 along an edge of the slot 102, a support bar 126 may be used to define a bottom edge, as shown in FIGS. 3 and 4. An alignment feature 128 may be separately provided along support bar 126, with a corresponding flange 130 on drawer 106. As shown more clearly in FIG. 4, alignment feature 128 comprises a prong 132 and a mounting tab 134 that is attached to the support bar 126 defining a bottom edge. An upper surface of alignment feature 128 is flush with, or below, the upper surface of support bar 126, so as to facilitate sliding drawers into the chassis. A plurality of alignment features 128 may be provided, each disposed along support bar 126 along the bottom edge to guide drawer 106 by engagement with edge 136 of flange 130 on a corresponding drawer 106.

Figure 5:
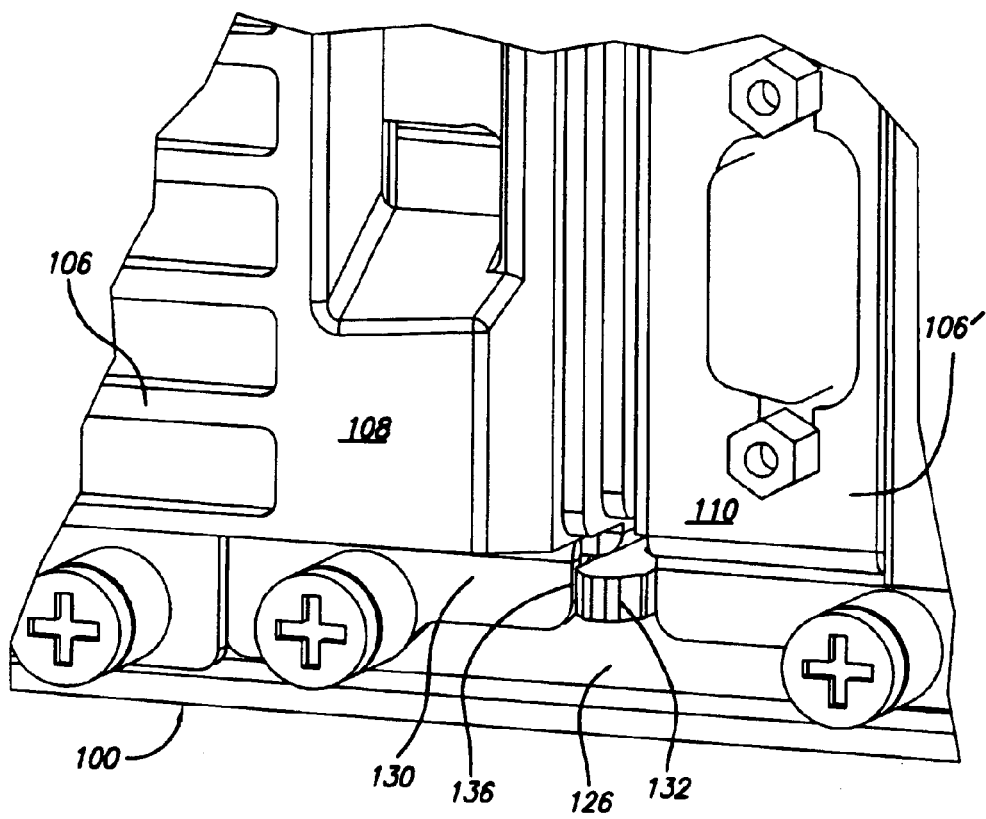
FIG. 5 is a detail view showing relative positions of an alignment prong and adjacent drawers in a fully inserted position.

FIG. 5 shows a more greatly magnified view of the relative positions of prong 132 and edge 136, when drawer 106 is fully inserted into slot 102. Essentially, prong 132 provides a precise spacing between adjacent drawers 106, 106', thereby ensuring alignment of both drawers along their bottom edges. At the same time, if drawer 106 is not properly aligned in its corresponding slot, interference between flange 130 and prong 132 will prevent full insertion of the drawer into the slot. The leading end of prong 132 may be tapered or chamfered to better guide drawer 106 into its slot by engagement with edge 136. In addition, or in the alternative, a prong (not shown) may be attached to, or formed in, drawer 106, configured to engage with a corresponding notch in the bottom edge 126 of the chassis.

Thus, drawer 106 may be aligned in slot 102 to a high degree of precision, being guided along both upper and lower ends. It should be apparent that the terms "upper" and "lower" are used herein relative to the orientation of the figures, and are not intended to imply that any particular orientation is required in practice. Drawers 106, chassis 100, and the alignment features may be oriented in any desired manner.

In an alternative embodiment, a drawer may be configured to fit only in a particular slot or slots by arrangement of complementary alignment features. For example, referring to FIGS. 1 and 2, a protruding alignment feature such as a guide tab 114 may be provided at a position on flange 112 that will interfere (not shown) with an upper flange 123 of drawers that are not intended to be inserted into the corresponding slot in the chassis, thereby preventing drawers from being inserted into a wrong slot. In comparison, a drawer that is intended for the slot may be provided with a cutout 122 in an appropriate location, both permitting its insertion into the slot and aligning it with respect to chassis 100.

Figure 6:
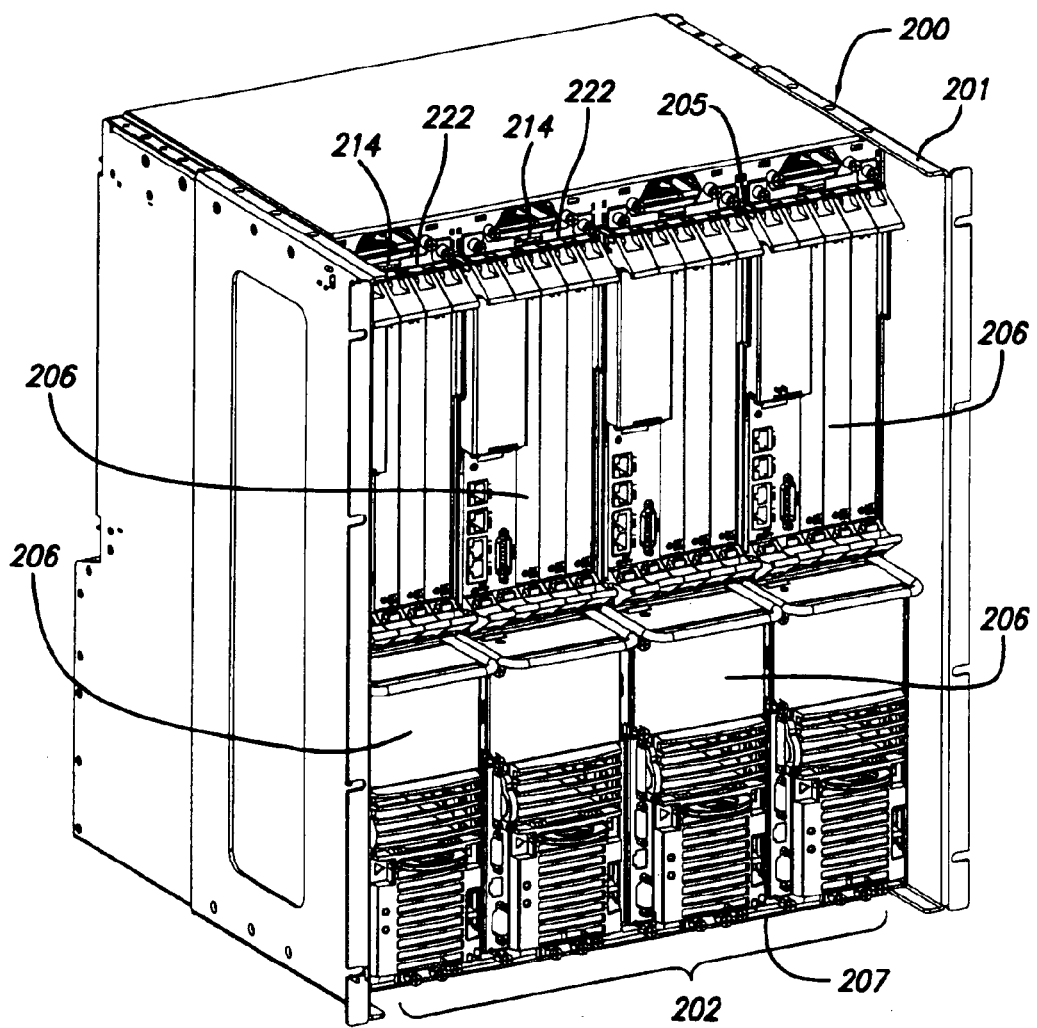
FIG. 6 shows the exemplary chassis with all slots filled by a plurality of drawers aligned to the chassis according to the invention.

Referring to FIG. 6, an exemplary computer chassis assembly 200 comprising a chassis 201, a plurality of slots 202, and a corresponding plurality of drawers 206 is depicted. Chassis 200 has an opening, which in the illustrated embodiment is completely filled by the plurality of drawers, positioned along a side of the chassis. Each of the slots 202 thereby has an opening bounded by opposing edges of the chassis, such as the upper edge 205 and lower edge 207. Each of the drawers 206 is inserted into a corresponding one of the plurality of slots 202. A plurality of first alignment features (e.g., guide tabs 214) are disposed along at least one of the opposing edges 205, 207 of the chassis. A plurality of second alignment features (e.g., cutouts 222) are disposed on the plurality of drawers 206. Each of the plurality of drawers has at least one of the plurality of second alignment features. Each of the first alignment features engages a mating one of the second alignment features, thereby aligning each of the drawers 206 to a corresponding one of the slots 202. Similar complementary alignment features, such as those described above, may be disposed along lower edge 207 and so as to engage corresponding lower portions of drawers 206.

Having thus described a preferred embodiment of the invention, it should be apparent to those skilled in the art that certain advantages of the within system have been achieved. It should also be appreciated that various modifications, adaptations, and alternative embodiments thereof may be made within the scope and spirit of the present invention. For example, particular shapes of guide features have been illustrated, but it should be apparent that the inventive concepts described above would be equally applicable to other shapes of guide features. The invention is further defined by the following claims.

What is claimed is:

1. A computer chassis assembly, comprising:
   a chassis;
   a plurality of slots opening along a side of the chassis, each of the slots having an opening bounded by opposing edges of the chassis;
   a plurality of drawers, each of the drawers being configured for insertion into a corresponding one of the plurality of slots;
   a plurality of first alignment features disposed along at least one of the opposing edges of the chassis; and
   a plurality of second alignment features disposed on the plurality of drawers, each of the plurality of drawers having at least one of the plurality of second alignment features, ones of the plurality of first alignment features engaging ones of the plurality of second alignment features to align each of the plurality of drawers to a corresponding one of the plurality of slots,
   wherein engagement between at least one of said second alignment features on one of said drawers and at least one of said first alignment features aligns said drawer such that the drawer does not occupy portions of at least one adjacent slot when said drawer is inserted in said corresponding one of the plurality of slots.

2. The computer chassis assembly of claim 1, wherein the plurality of first alignment features further comprise cutouts disposed along at least one of the opposing edges of the chassis.

3. The computer chassis assembly of claim 1, wherein the plurality of first alignment features further comprise guide tabs disposed along at least one of the opposing edges of the chassis.

4. The computer chassis assembly of claim 1, wherein the plurality of first alignment features further comprise holes disposed along at least one of the opposing edges of the chassis.

5. The computer chassis assembly of claim 1, wherein the plurality of first alignment features comprise protrusions from at least one of the opposing edges of the chassis.

6. The computer chassis assembly of claim 1, wherein the plurality of second alignment features each further comprises a cutout adjacent to a periphery of a housing of each of the plurality of drawers.

7. The computer chassis assembly of claim 1, wherein the plurality of second alignment features each further comprises a guide tab adjacent to a periphery of each of the plurality of drawers.

8. The computer chassis assembly of claim 1, wherein the plurality of second alignment features each further comprises a protrusion adjacent to a periphery of each of the plurality of drawers.

9. The computer chassis assembly of claim 1, further comprising a plurality of fasteners configured to fasten the plurality of drawers to the chassis, wherein the plurality of fasteners permits an amount of free play between each of the plurality of drawers and corresponding ones of the plurality of slots that is greater than an amount of free play permitted by the plurality of first alignment features when engaged with the plurality of second alignment features.

10. The computer chassis assembly of claim 1, wherein engagement between at least one of said second alignment features on one of said drawers and at least one of said first alignment features aligns said drawer in said slot such that said drawer does not occupy portions of either adjacent slot when said drawer is inserted in said corresponding one of said plurality of slots.

11. The computer chassis assembly of claim 1, wherein interference between at least one of said first alignment features and said second alignment features on one of said drawers inhibits full insertion of said drawer if said drawer is not properly aligned with said slot.

12. The computer chassis assembly of claim 1, wherein at least one of said first alignment features or second alignment features comprises a tapered end to help guide one of said drawers into a corresponding one of said plurality of slots.

13. A chassis configured to receive a plurality of drawers for electronic components into a corresponding plurality of slots, the chassis comprising:
   housing enclosing the plurality of slots, the housing having an opening configured for insertion of the plurality of drawers between opposing edges of the opening; and
   a plurality of first alignment features disposed along at least one of the opposing edges of the opening, wherein the plurality of first alignment features are configured to engage a plurality of second alignment features disposed on the plurality of drawers to align each of the plurality of drawers to a corresponding one of the plurality of slots;
   wherein engagement between at least one of said second alignment features on one of said drawers and at least one of said first alignment features aligns said drawer in said slot such that said drawer does not occupy portions of at least one adjacent slot when said drawer is inserted in said corresponding one of the plurality of slots.

14. The chassis of claim 13, wherein the plurality of first alignment features further comprise edges of cutouts disposed along at least one of the opposing edges of the opening.

15. The chassis of claim 13, wherein the plurality of first alignment features further comprise guide tabs disposed along at least one of the opposing edges of the opening.

16. The chassis of claim 13, wherein the plurality of first alignment features further comprise holes disposed along at least one of the opposing edges of the opening.

17. The chassis of claim 13, wherein the plurality of first alignment features comprise protrusions from at least one of the opposing edges of the opening.

18. The chassis of claim 13, wherein the plurality of first alignment features comprise prongs attached to the chassis along at least one of the opposing edges of the chassis.

19. A computer chassis assembly, comprising:

a chassis;

a plurality of slots opening along a side of the chassis, each of the slots having an opening bounded by opposing edges of the chassis;

a plurality of drawers, each of the drawers being configured for insertion into a corresponding one of the plurality of slots;

a plurality of first alignment features disposed along at least one of the opposing edges of the chassis; and a plurality of second alignment features disposed on the plurality of drawers, each of the plurality of drawers having at least one of the plurality of second alignment features, ones of the plurality of first alignment features engaging ones of the plurality of second alignment features to align each of the plurality of drawers to a corresponding one of the plurality of slots, wherein at least one of said second alignment features on one of said drawers is configured to interfere with one of said first alignment features if said drawer is inserted into a wrong slot.

20. The computer chassis assembly of claim 19, wherein said plurality of first alignment features comprises a plurality of guide tabs, wherein said plurality of second alignment features comprises a plurality of cutouts.

* * * * *